(12) United States Patent
Liou et al.

(10) Patent No.: US 11,699,696 B2
(45) Date of Patent: Jul. 11, 2023

(54) SILICON-CONTROLLED RECTIFIER WITH BACK-TO-BACK DIODES

(71) Applicant: Powerchip Semiconductor Manufacturing Corporation, Hsinchu (TW)

(72) Inventors: Juin Jei Liou, New Taipei (TW); Wenqiang Song, Chengdu (CN); Ching-Sung Ho, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 197 days.

(21) Appl. No.: 17/218,168

(22) Filed: Mar. 31, 2021

(65) Prior Publication Data

US 2022/0293585 A1 Sep. 15, 2022

(30) Foreign Application Priority Data

Mar. 9, 2021 (CN) .......................... 202110253917.2

(51) Int. Cl.
*H01L 27/02* (2006.01)
(52) U.S. Cl.
CPC .................. *H01L 27/0262* (2013.01)
(58) Field of Classification Search
None
See application file for complete search history.

(56) References Cited

U.S. PATENT DOCUMENTS

| 4,939,616 A | 7/1990 | Rountree |
| 5,856,214 A * | 1/1999 | Yu .......................... H01L 29/87 438/983 |
| 6,768,616 B2 | 7/2004 | Mergens et al. |

(Continued)

FOREIGN PATENT DOCUMENTS

| CN | 107564906 | 1/2018 |
| TW | 201401476 | 1/2014 |

OTHER PUBLICATIONS

Hailian Liang et al., "Design of a Gate Diode Triggered SCR for Dual-Direction High-Voltage ESD Protection", IEEE Electron Device Letters, vol. 40, No. 2, Feb. 2019, pp. 163-166.

(Continued)

*Primary Examiner* — Bilkis Jahan
(74) *Attorney, Agent, or Firm* — JCIPRNET

(57) ABSTRACT

A silicon-controlled rectifier includes a substrate of a first conductivity type; a deep well region of a second conductivity type; a well regions of the first conductivity type and the second conductivity type; a first, second and third heavily doped active regions of the first conductivity type; a first, second and third heavily doped active regions of the second conductivity type; and a first, second and third shallow trench isolation structures. A reverse diode formed in the third heavily doped active region of the second conductivity type and the well region of the first conductivity type is embedded, and a forward diode is formed in the heavily doped active region of the first conductivity type and the well region of the second conductivity type. By sharing the third heavily doped active region of the second conductivity type across the well regions of different conductivity types, two back-to-back diodes are formed.

8 Claims, 5 Drawing Sheets

(56) References Cited

U.S. PATENT DOCUMENTS

| | | | |
|---|---|---|---|
| 9,704,849 B2* | 7/2017 | Laine | H01L 27/0255 |
| 10,366,992 B2* | 7/2019 | Chang | H01L 29/1083 |
| 2006/0151836 A1* | 7/2006 | Salcedo | H01L 29/7436 |
| | | | 257/362 |
| 2017/0366002 A1 | 12/2017 | Zhao et al. | |

OTHER PUBLICATIONS

"Office Action of Taiwan Counterpart Application", dated Jul. 15, 2021, p. 1-p. 4.

* cited by examiner

SILICON-CONTROLLED RECTIFIER WITH BACK-TO-BACK DIODES

CROSS-REFERENCE TO RELATED APPLICATION

This application claims the priority benefit of China application serial no. 202110253917.2, filed on Mar. 9, 2021. The entirety of the above-mentioned patent application is hereby incorporated by reference herein and made a part of this specification.

BACKGROUND

1. Technical Field

The disclosure relates to a semiconductor static protection technology, and particularly relates to a silicon-controlled rectifier (SCR) for unidirectional electro-static discharge (ESD) protection.

2. Description of Related Art

With the continuous improvement of integrated circuit technology, static discharges (ESD) have become a serious problem affecting the reliability of integrated circuits. More than one-third of the reliability problems of integrated circuits are caused by ESD, which severely restrict the reliability of semiconductor products. Therefore, it is essential to design effective ESD protection for integrated circuits.

In terms of chip ESD protection design, the traditional ESD protection design takes up a considerable chip area and brings great cost pressure. In order to implement reliable ESD protection in the smallest possible area, the silicon-controlled rectifier (SCR) is an effective choice, having extremely highs unit robustness and taking up a very small chip area, but the sustain voltage ($V_h$) of SCR is usually very low. When the sustain voltage is lower than the operating voltage $V_{DD}$ of the chip, a serious problem is brought about: latch-up. In order to avoid the reliability problems caused by latch-up, ESD protection devices are usually required to have a sustain voltage higher than the operating voltage $V_{DD}$.

A commonly used ESD protection device is MLSCR (modified lateral silicon-controlled rectifier) as shown in FIG. 1A, which includes a substrate 100, a deep N-well region, a N-well region, a P-well region, a N+ region 102a, a N+ region 102b, a N+ region 102c, a P+ region 104a, a P+ region 104b, and a shallow trench isolation structure STI for isolating each active region. The N+ region 102c shared across the N-well region and the P-well region can effectively reduce the trigger voltage of the device. FIG. 1B is an equivalent circuit diagram of a MLSCR of FIG. 1A, showing two discharge paths P1 and P2. Due to current discharge of the surface parasitic transistor formed in the cross-over N+ region 102c (discharge path P1), the sustain voltage of the MLSCR is higher than the sustain voltage of traditional SCRs, but in most cases it is still not enough to achieve latch-up immunity.

SUMMARY

The disclosure relates to a silicon-controlled rectifier including an ESD current discharge circuit formed by surface (gate-controlled) diodes, which can greatly increase the sustain voltage of the device. Moreover, by adjusting a width of the (gate-controlled) diode active region, the sustain voltage of the device can be flexibly adjusted.

According to the embodiments of the disclosure, a silicon-controlled rectifier includes: a substrate of a first conductivity type; a deep well region of a second conductivity type; a well region of the first conductivity type; a well region of the second conductivity type; a first heavily doped active region of the second conductivity type; a first heavily doped active region of the first conductivity type; a second heavily doped active region of the second conductivity type; a second heavily doped active region of the first conductivity type; a third heavily doped active region of the second conductivity type; and a third heavily doped active region of the first conductivity type. The deep well region of a second conductivity type is formed in the substrate. The well region of the first conductivity type and the well region of the second conductivity type are formed side by side in the deep well region. The first heavily doped active region of the second conductivity type and the first heavily doped active region of the first conductivity type are disposed in the well region of the second conductivity type, both connected to the anode, and a first shallow trench isolation structure is disposed in between the two. The second heavily doped active region of the second conductivity type and the second heavily doped active region of first conductivity type are disposed in the well region of the first conductivity type, both connected to the cathode, and a second shallow trench isolation structure is disposed in between the two. The third heavily doped active region of the second conductivity type is shared across the well region of the first conductivity type and the well region of the second conductivity type, where the third heavily doped active region of the second conductivity type is separated from the first heavily doped active region of the first conductivity type by a first distance, and a forward diode is formed in the first heavily doped active region of the first conductivity type and the well region of the second conductivity type. The third heavily doped active region of the first conductivity type is disposed in the well region of the first conductivity type provided between the second heavily doped active region of the second conductivity type and the third heavily doped active region of the second conductivity type, where a third shallow trench isolation structure is disposed in between the second heavily doped active region of the second conductivity type and the third heavily doped active region of the first conductivity type, the third heavily doped active region of second conductivity type is separated from the third heavily doped active region of first conductivity type by a second distance, and a reverse diode is formed in the third heavily doped active region of the second conductivity type and the well region of the first conductivity.

The silicon-controlled rectifier according to an embodiment of the disclosure, the first conductivity type is P-type, and the second conductivity type is N-type.

The silicon-controlled rectifier according to an embodiment of the disclosure, the first conductivity type is N-type, and the second conductivity type is P-type.

The silicon-controlled rectifier according to an embodiment of the disclosure, the first distance meets a minimum distance requirement of a gate design rule.

The silicon-controlled rectifier according to an embodiment of the disclosure, the second distance meets a minimum distance requirement of a gate design rule.

The silicon-controlled rectifier according to an embodiment of the disclosure, the third heavily doped active region of the first conductivity type is in a floating status.

The silicon-controlled rectifier according to an embodiment of the disclosure, further including: a first gate and a second gate. The first gate is formed on the substrate between the first heavily doped active region of the first conductivity type and the third heavily doped active region of the second conductivity type. The second gate is formed on the substrate between the third heavily doped active region of the first conductivity type and the third heavily doped active region of the second conductivity type. The first gate, the second gate, and the third heavily doped active region of the second conductivity type are electrically connected.

The silicon-controlled rectifier according to an embodiment of the disclosure, further including: a self-aligned silicide block (SAB) and a second gate. The SAB is formed on the substrate between the first heavily doped active region of the first conductivity type and the third heavily doped active region of the second conductivity type. The second gate is formed on the substrate between the third heavily doped active region of the first conductivity type and the third heavily doped active region of the second conductivity type. The second gate, and the third heavily doped active region of the second conductivity type are electrically connected.

Based on the above, according to the silicon-controlled rectifier of the disclosure, a reverse diode in the well region of the first conductivity type is embedded so as to remove one of the shallow trench isolation structures of the well region of the second conductivity type in the MLSCR and a forward diode is formed; by the cross-over third heavily doped active region of the second conductivity type, two back-to-back diodes are formed. In this way, the ESD current can be discharged from the circuit formed by the surface diodes so as to increase the sustain voltage of the device, and the current path length of the diode can be reduced by the setting of the forward diode. Further, replacing the reverse diode with the reverse gate-controlled diode can also achieve lower trigger and faster response time under ESD pressure without using other trigger devices.

The accompanying drawings are included to provide a further understanding of the disclosure, and are incorporated in and constitute a part of the disclosure. The drawings illustrate embodiments of the disclosure and, together with the description, serve to explain the principles of the disclosure.

BRIEF DESCRIPTION OF THE DRAWINGS

The accompanying drawings are included to provide a further understanding of the disclosure, and are incorporated in and constitute a part of the disclosure. The drawings illustrate embodiments of the disclosure and, together with the description, serve to explain the principles of the disclosure.

FIG. 5A is a current simulation density distribution diagram at a moment when a reverse gate-controlled diode D2 of a SCR of a second embodiment is turned on.

FIG. 5B is a current simulation density distribution diagram at a time when a parasitic NPN of a SCR of a second embodiment is turned on.

FIG. 5C is a current simulation density distribution diagram at a time when a SCR of a second embodiment is turned on.

DESCRIPTION OF THE EMBODIMENTS

Figure 1A:
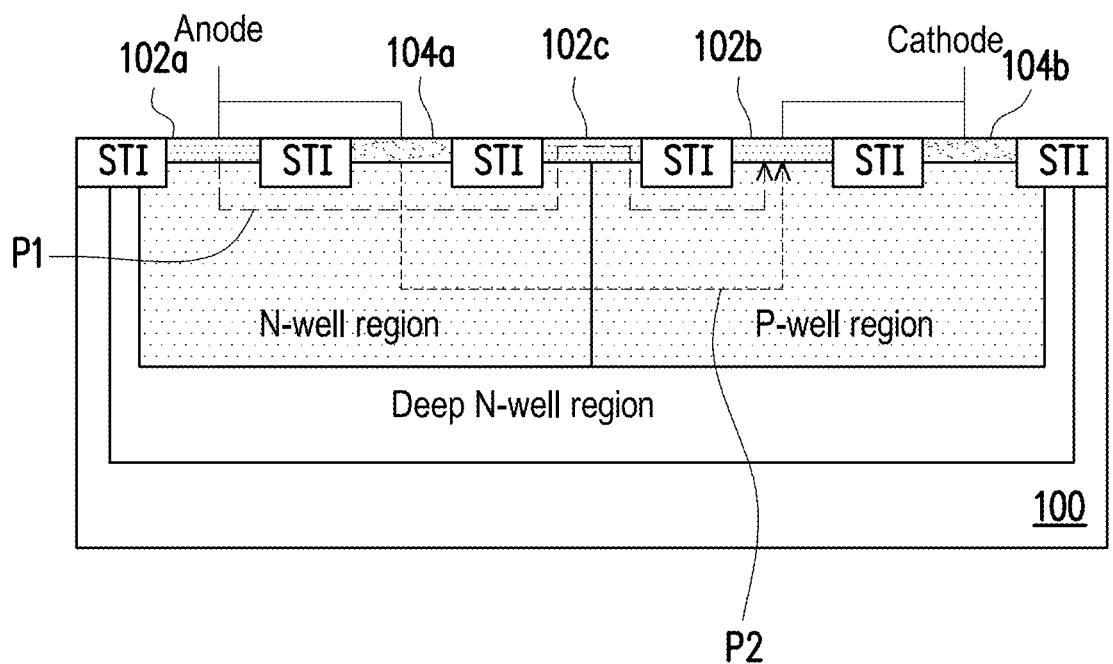
FIG. 1A is a cross-sectional diagram of an existing MLSCR.
Figure 1B:
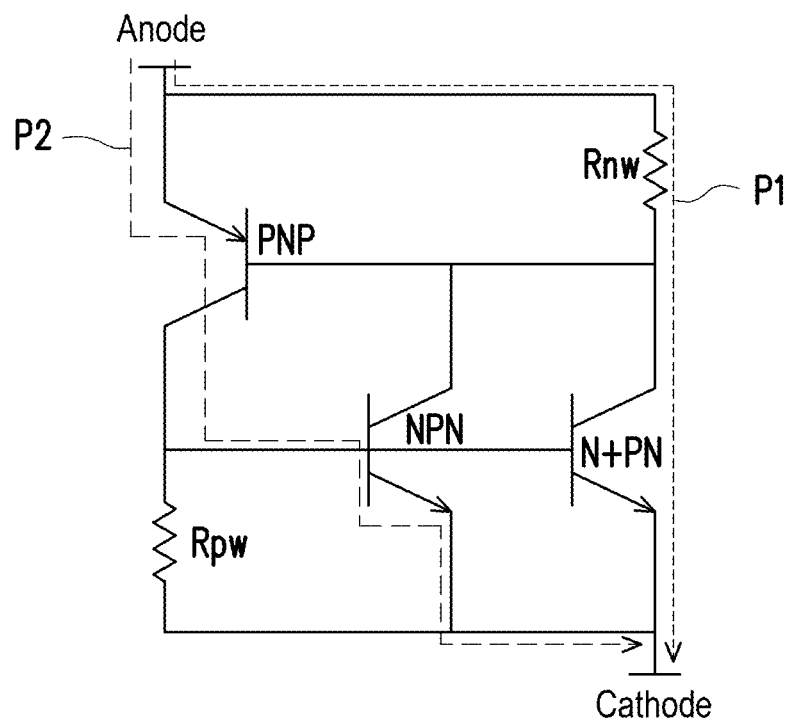
FIG. 1B is an equivalent circuit diagram of a MLSCR of FIG. 1A.

Hereinafter, the embodiment of disclosure will be described in detail. However, these embodiments are exemplary, and the disclosure is not limited thereto. In addition, the drawings are only for description purposes and are not drawn according to the original size. Wherever possible, the same component numerals are used in the drawings and descriptions to refer to the same or similar parts.

Figure 2A:
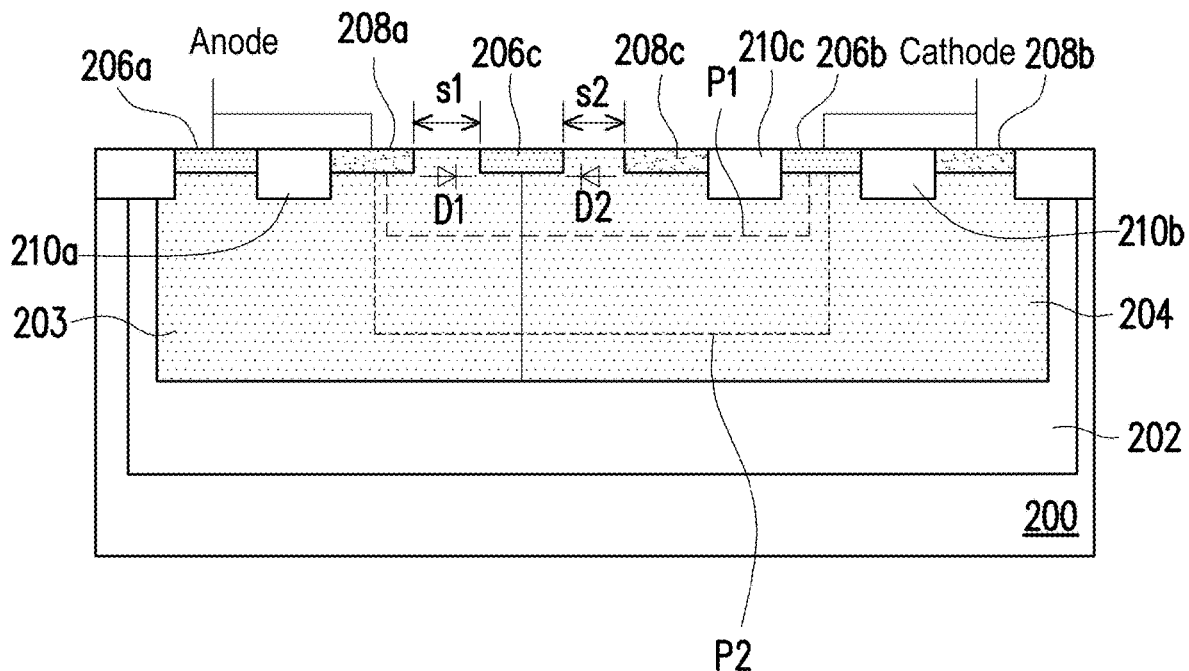
FIG. 2A is a cross-sectional diagram of a SCR according to a first embodiment of the disclosure.

FIG. 2A is a cross-sectional diagram of a silicon-controller rectifier (SCR) according to a first embodiment of the disclosure.

With reference to FIG. 2A, the SCR of the first embodiment is an enhanced diode-triggered silicon-controlled rectifier (EDTSCR), including: a substrate 200 of a first conductivity type; a deep well region 202 of a second conductivity type; a well region 204 of the first conductivity type; a well region 203 of the second conductivity type; a first heavily doped active region 208a of the first conductivity type; a second heavily doped active region 208b of the first conductivity type; a third heavily doped active region 208c of the first conductivity type; a first heavily doped active region 206a of the second conductivity type; a second heavily doped active region 206b of the second conductivity type; a third heavily doped active region 206c of the second conductivity type; a first shallow trench isolation structure 210a; a second shallow trench isolation structure 210b; and a third shallow trench isolation structure 210c. In the substrate 200, the well region 204 of the first conductivity type and the well region 203 of the second conductivity type are formed side by side in the deep well region 202. The first heavily doped active region 206a of the second conductivity type and the first heavily doped active region 208a of the first conductivity type are disposed in the well region 203 of the second conductivity type, and the first heavily doped active region 206a of the second conductivity type and the first heavily doped active region 208a of the first conductivity type are both connected to the anode. The first shallow trench isolation structure 210a is disposed in between the first heavily doped active region 206a of the second conductivity type and the first heavily doped active region 208a of the first conductivity type. The second heavily doped active region 206b of the second conductivity type and the second heavily doped active region 208b of the first conductivity type are disposed in the well region 204 of the first conductivity type, and the second heavily doped active region 206b of the second conductivity type and the second heavily doped active region 208b of the first conductivity type are both connected to a cathode. The second shallow trench isolation structure 210b is disposed in between the second heavily doped active region 206b of the second conductivity type and the second heavily doped active region 208b of the first conductivity type.

In the present embodiment, the first conductivity type is P-type, and the second conductivity type is N-type. However, the disclosure is not limited to thereto. In another embodiment, the first conductivity type is N-type, and the second conductivity type is P-type.

Please continue to refer to FIG. 2A. The third heavily doped active region 206c of the second conductivity type is shared across the well region 204 of the first conductivity type and the well region 203 of the second conductivity type, and a positive diode D1 is formed in the first heavily doped active region 208a of the first conductivity type and the well region 203 of the second conductivity type. The third heavily doped active region 206c of the second conductivity type is separated from the first heavily doped active region 208a of the first conductivity type by a first distance s1, and there is no shallow trench isolation structure disposed in between. Therefore, the first distance s1 only needs to meet a minimum distance requirement of the gate design rule; as a result, the current path (discharge path P1) length can be greatly shortened. Taking the semiconductor manufacturing process below 0.25 micrometers as an example, a minimum width of the shallow trench isolation structure is about 0.4 to 4 micrometers, so the ESD protection device in which no shallow trench isolation structure is provided can basically shorten the current path of 0.4 to 4 micrometers. The third heavily doped active region 208c of the first conductivity type is disposed in the well region 204 of the first conductivity type provided between the second heavily doped active region 206b of the second conductivity type and the third heavily doped active region 206c of the second conductivity type, and the third heavily doped active region 208c of the first conductivity type of the present embodiment is in a floating status. The third shallow trench isolation structure 210c is disposed in between the second heavily doped active region 206b of the second conductivity type and the third heavily doped active region 208c of the first conductivity type. A reverse diode D2 is formed in the third heavily doped active region 206c of the second conductivity type and the well region 204 of the first conductivity type. In order to facilitate the turn-on of the reverse diode D2, a second distance s2 between the third heavily doped active region 206c of the second conductivity type and the third heavily doped active region 208c of the first conductivity type preferably meets a minimum distance requirement of the gate design rule.

Figure 2B:
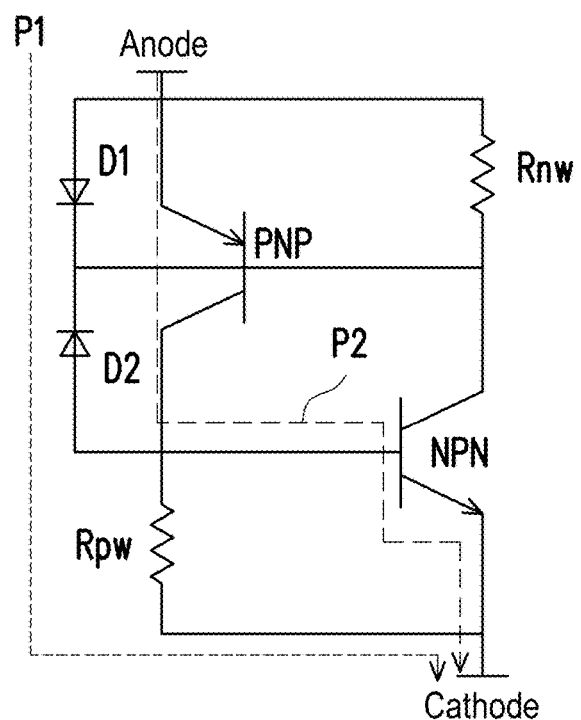
FIG. 2B is an equivalent circuit diagram of a SCR of FIG. 2A.

FIG. 2B is an equivalent circuit diagram of the SCR of FIG. 2A, where P-type is the first conductivity type and N-type is the second conductivity type. Referring to both FIG. 2A and FIG. 2B, since the turn-on voltage of the forward diode D1 is very low (such as 0.7V), when ESD stress arrives, avalanche breakdown occurs first at an N+/PW junction (the junction between the third heavily doped active region 206c of the second conductivity type and the well region 204 of the first conductivity type) and the discharge path P1 of D1, D2, and PW is turned on. In order to keep the reverse diode D2 turned on, avalanche breakdown occurs continuously at the N+/PW junction, which causes the sustain voltage of the EDTSCR to rise.

After a parasitic transistor NPN is turned on, the generated electrons form a pressure drop across an NW junction. When a voltage of a P+/NW junction (the junction of the first heavily doped active region 208a of the first conductivity type and the well region 203 of the second conductivity type) exceeds 0.7V, a parasitic transistor PNP is turned on. There is positive feedback between the parasitic transistor NPN and the parasitic transistor PNP, such that the SCR is turned on. The charge injection generated by the positive feedback makes the resistor of the SCR show a negative differential resistor status, that is, the doping becomes larger and the resistor becomes smaller, and the SCR will have obvious hysteresis.

Figure 3A:
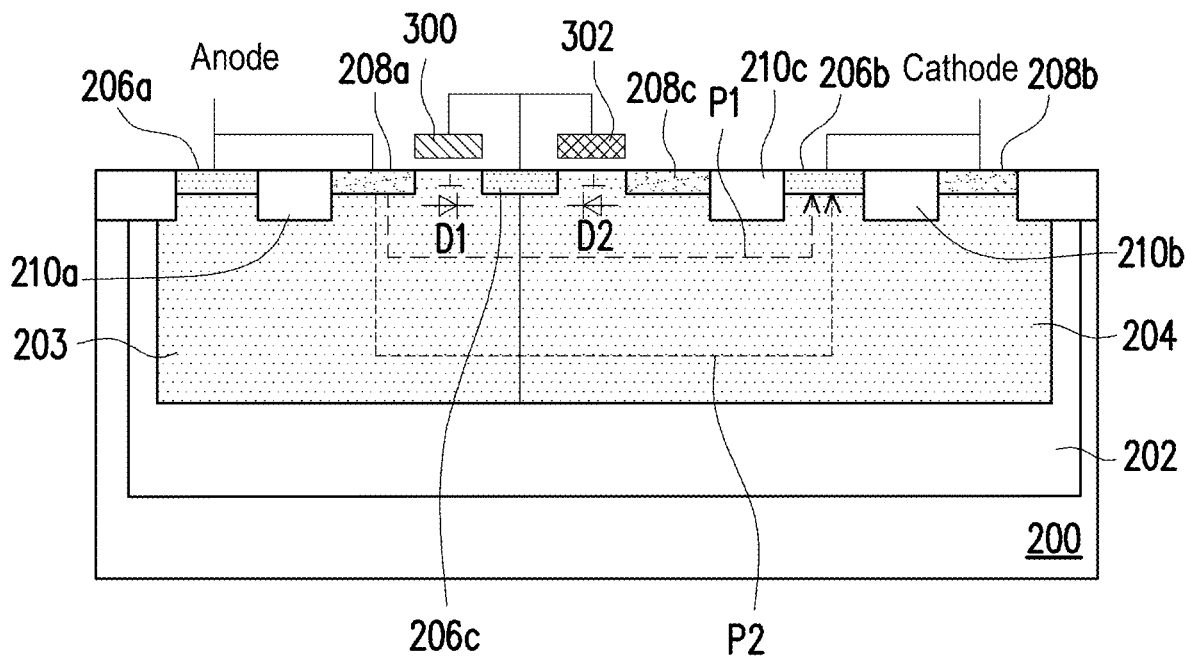
FIG. 3A is a cross-sectional diagram of a SCR according to a second embodiment of the disclosure.
Figure 3B:
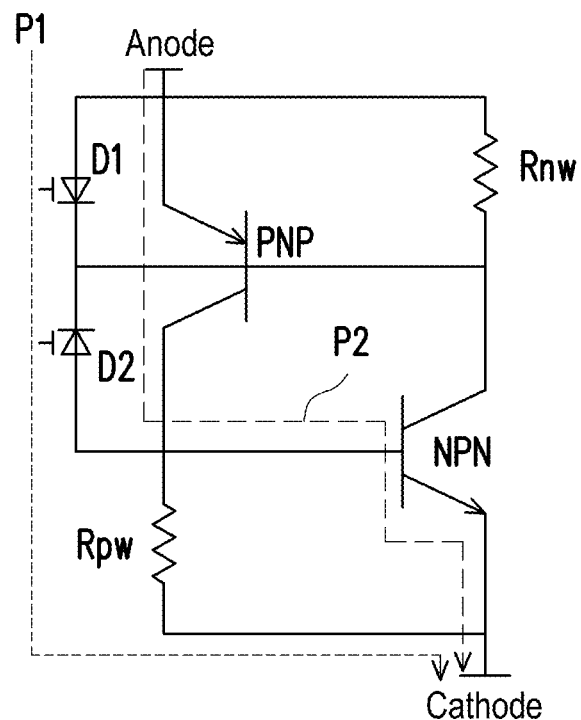
FIG. 3B is an equivalent circuit diagram of a SCR of FIG. 3A.

FIG. 3A is a cross-sectional diagram of a SCR according to a second embodiment of the disclosure, in which the same reference numerals as in the first embodiment are used to denote the same or similar components, and the description of the same technical content is omitted. For the description of the omitted parts, reference can be made to the foregoing, and the details are not repeated in this embodiment. FIG. 3B is an equivalent circuit diagram of the SCR of FIG. 3A.

Referring to both FIG. 3A and FIG. 3B, the SCR of the second embodiment is an enhanced gate-controlled-diode-triggered silicon-controlled rectifier (EGDTSCR). Compared with the first embodiment, the EGDTSCR further includes a first gate 300 and a second gate 302. The first gate 300 is formed on the substrate 200 between the first heavily doped active region 208a of the first conductivity type and the third heavily doped active region 206c of the second conductivity type. The second gate 302 is formed on the substrate 200 between the third heavily doped active region 208c of the first conductivity type and the third heavily doped active region 206c of the second conductivity type. The first gate 300, the second gate 302, and the third heavily doped active region 206c of the second conductivity type are electrically connected.

Taking P-type as the first conductivity type and N-type as the second conductivity type as an example, when ESD stress arrives, avalanche breakdown occurs first at the N+/PW junction, and the reverse (gate-controlled) diode D2 is turned on immediately. Then the ESD current is discharged to the cathode through the reverse diode D2 and the PW. The ESD current in the PW converges in a floating P+ region (the third heavily doped active region 208c of the first conductivity type) because the high doping concentration of the floating P+ region. Moreover, the ESD current will apply a voltage to the second gate 302 through the cross-over N+ region (the third heavily doped active region 206c of the second conductivity type), which will increase the discharge capacity of the reverse diode D2 and accelerate the turn-on of the conductive reverse diode D2.

For the reverse diode D2, RC gate coupling effect by a gate capacitor and an N-well resistor helps to trigger the device. The gate capacitor is composed of the second gate 302, and the resistor is composed of the cross-over N+ region resistor and the N-well (the well region 203 of the second conductivity type) resistor. A gate voltage generated further enhances such effect, thereby improving the current discharge capacity of the forward (gate-controlled) diode D1 and the reverse (gate-controlled) diode D2. As a result, the SCR of the second embodiment can achieve a lower trigger and a faster response time under ESD pressure without using other trigger devices. Once the reverse diode D2 is turned on, the surface gate-controlled diode circuit (discharge path P1) starts to discharge the ESD current, and the parasitic transistor NPN will also be turned on. After the parasitic transistor NPN and the parasitic transistor PNP are turned on successively, finally the SCR path (the discharge path P2) is triggered to discharge the main ESD current.

In EGDTSCR, compared with the existing MLSCR, by embedding a reverse diode D2 in the well region 204 of the first conductivity type, a gate-controlled diode is formed by pairing the forward diode D1 in the well region 203 of the second conductivity type with the first gate 300, and two back-to-back gate-controlled diodes are formed in the cross-over the third heavily doped active region 206c of the second conductivity type. The first gate 300 and the second gate 302 may be connected to the third heavily doped active region 206c of the second conductivity type through metal such that an ESD current discharge circuit formed by the surface gate-controlled diodes is formed, which can greatly increase the sustain voltage of the device. Moreover, by adjusting the width of the active region of the gate-controlled diode, the sustain voltage of the device can be flexibly adjusted.

Figure 4A:
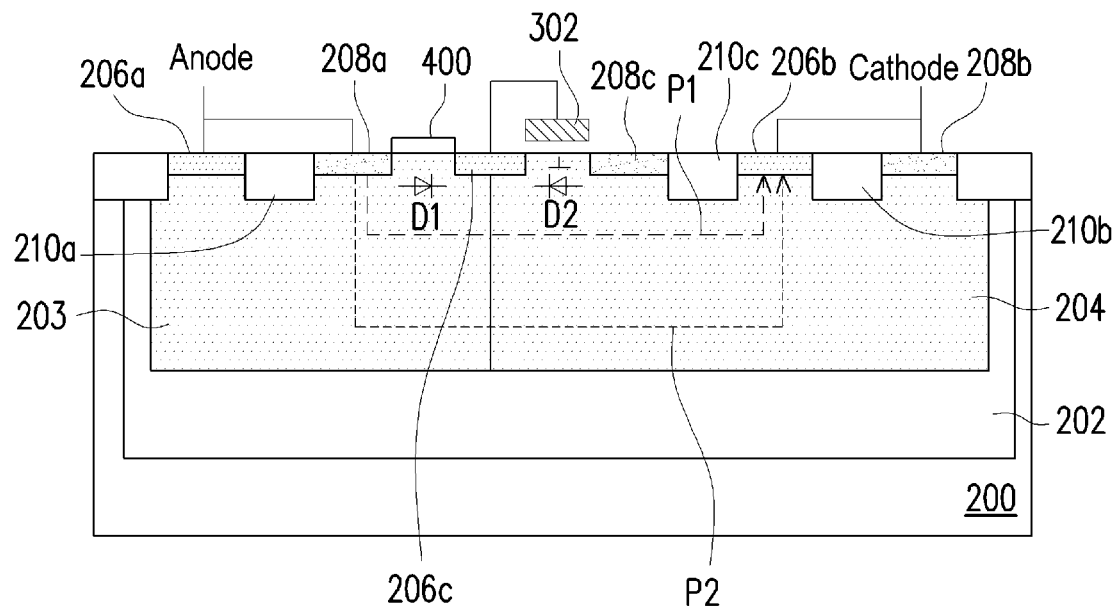
FIG. 4A is a cross-sectional diagram of a SCR according to a third embodiment of the disclosure.
Figure 4B:
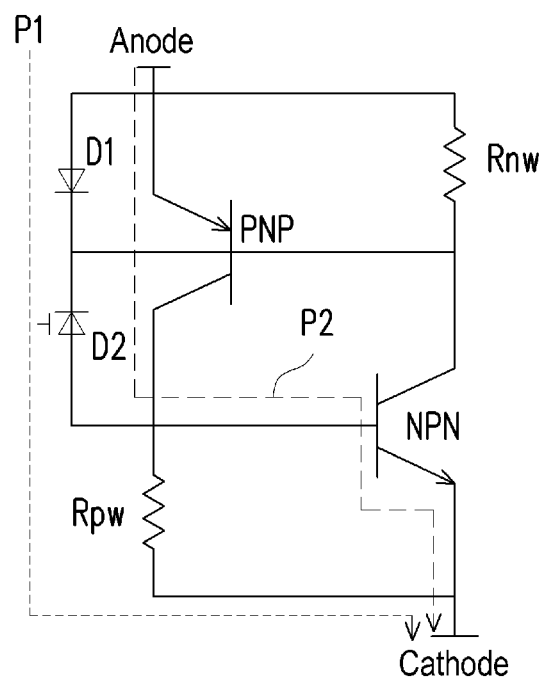
FIG. 4B is an equivalent circuit diagram of a SCR of FIG. 4A.

FIG. 4A is a cross-sectional diagram of a SCR according to a third embodiment of the disclosure, in which the same reference numerals as in the first embodiment are used to denote the same or similar components, and the description of the same technical content is omitted. For the description of the omitted parts, reference can be made to the foregoing embodiments, and the details are not repeated in this embodiment. FIG. 3B is an equivalent circuit diagram of a SCR of FIG. 3A. FIG. 4B is an equivalent circuit diagram of a SCR of FIG. 4A.

Referring to both FIG. 4A and FIG. 4B, the difference between the SCR of the third embodiment and the first embodiment lies in that a self-aligned silicide block (SAB) 400 is disposed on the substrate 200 between the first heavily doped active region 208a of the first conductivity type and the third heavily doped active region 206c of the second conductivity type; a second gate 302 is disposed on the substrate 200 between the third heavily doped active region 208c of the first conductivity type and the third heavily doped active region 206c of the second conductivity type; and the second gate 302, and the third heavily doped active region 206c of the second conductivity type are electrically connected. As a result, in the third embodiment, the trigger path of D1 can also be shortened; the working process can be referred to in the first embodiment, which will not be repeated in the present embodiment.

The following is a simulation experiment to verify the effect of the disclosure, but the disclosure is not limited to the following content.

Figure 5A:
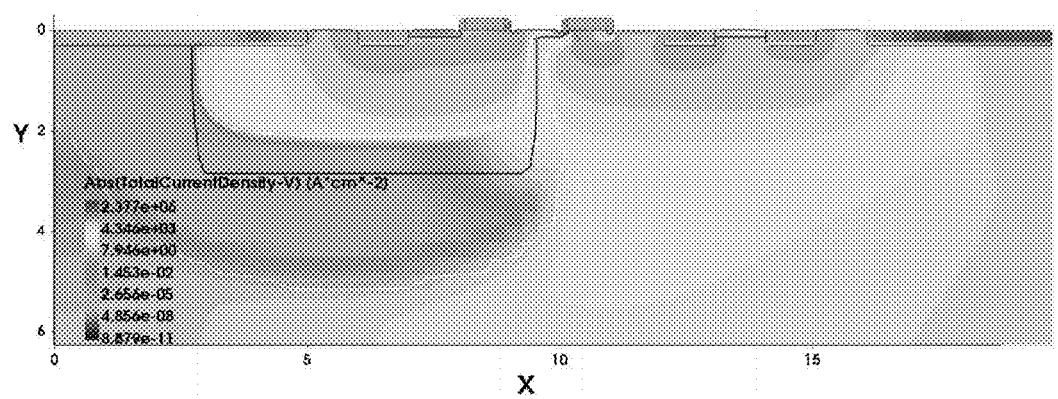
Figure 5B:
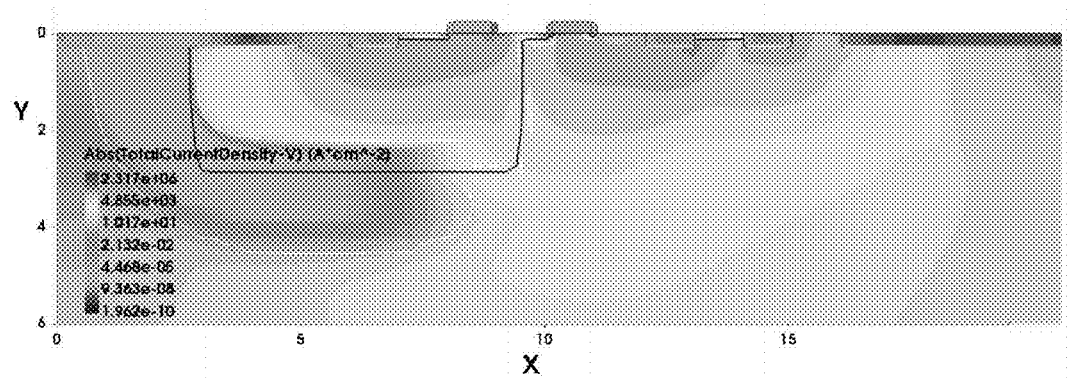
Figure 5C:
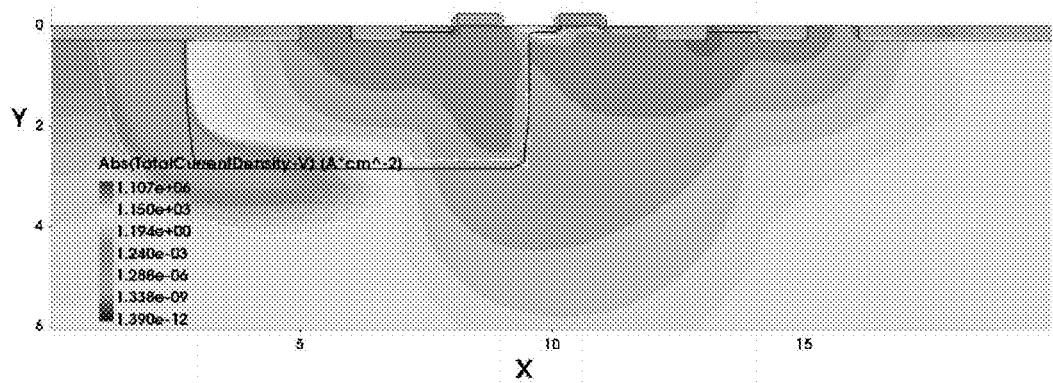

In the simulation experiment, taking P-type as the first conductivity type and N-type as the second conductivity type as an example, the EGDTSCR shown in FIG. 3A is used to perform an ESD current experiment to obtain a current simulation density distribution of the EGDTSCR at different timings. FIG. 5A is a current simulation density distribution diagram at a moment when a reverse gate-controlled diode D2 of a SCR of the second embodiment is turned on. It can be seen that the ESD current is discharged to the cathode through the reverse diode D2 and the PW, and the ESD current in the PW converges in the floating P+ region. FIG. 5B is a current simulation density distribution diagram at a time when a parasitic NPN of a SCR of the second embodiment is turned on, and FIG. 5C is a current simulation density distribution diagram at a time when a SCR of the second embodiment is turned on.

In summary, according to the silicon-controlled rectifier of the disclosure, the ESD current can be discharged from the circuit formed by the surface diodes by forming two back-to-back diodes in the cross-over heavily doped active region, so as to increase the sustain voltage of the device, and the current path length of the diode can be reduced by the setting of the forward diode. Further, replacing the back-to-back diode with the gate-controlled diode can also achieve lower trigger and faster response time under ESD pressure without using other trigger devices. Moreover, by adjusting the width of active region of the gate-controlled diode, the sustain voltage of the device can be flexibly adjusted.

Finally, it should be noted that the above embodiments are only used to illustrate the technical solution of the disclosure, but not limited thereto. Although the disclosure is described in detail with reference to the above-mentioned embodiments, those skilled in the art should understand that the technical solutions described in the above-mentioned embodiments can still be modified, and some or all of the technical features may be replaced equivalently; such modifications or replacements do not depart from the scope of the technical solutions described by the embodiments of the disclosure.

What is claimed is:

1. A silicon-controlled rectifier, comprising:
a substrate of a first conductivity type;
a deep well region of a second conductivity type, formed in the substrate;
a well region of the first conductivity type and a well region of the second conductivity type, formed side by side in the deep well region;
wherein a first heavily doped active region of the second conductivity type and a first heavily doped active region of the first conductivity type are disposed in the well region of the second conductivity type, the first heavily doped active region of the second conductivity type and the first heavily doped active region of the first conductivity type are both connected to an anode, and a first shallow trench isolation structure is disposed in between the two;
a second heavily doped active region of the second conductivity type and a second heavily doped active region of first conductivity type are disposed in the well region of the first conductivity type, the second heavily doped active region of the second conductivity type and the second heavily doped active region of the first conductivity type are both connected to a cathode, and a second shallow trench isolation structure is disposed in between the two;
a third heavily doped active region of the second conductivity type, shared across the well region of the first conductivity type and the well region of the second conductivity type, wherein the third heavily doped active region of the second conductivity type is separated from the first heavily doped active region of the first conductivity type by a first distance, and a forward diode is formed in the first heavily doped active region of the first conductivity type and the well region of the second conductivity type; and
a third heavily doped active region of the first conductivity type, disposed in the well region of the first conductivity type provided between the second heavily doped active region of the second conductivity type and the third heavily doped active region of the second conductivity type, wherein a third shallow trench isolation structure is disposed in between the second heavily doped active region of the second conductivity type and the third heavily doped active region of the first conductivity type, the third heavily doped active region of second conductivity type is separated from the third heavily doped active region of first conductivity type by a second distance, and a reverse diode is formed in the third heavily doped active region of the second conductivity type and the well region of the first conductivity.

2. The silicon-controlled rectifier according to claim 1, wherein the first conductivity type is P-type, and the second conductivity type is N-type.

3. The silicon-controlled rectifier according to claim 1, wherein the first conductivity type is N-type, and the second conductivity type is P-type.

4. The silicon-controlled rectifier according to claim 1, wherein the first distance meets a minimum distance requirement of a gate design rule.

5. The silicon-controlled rectifier according to claim 1, wherein the second distance meets a minimum distance requirement of a gate design rule.

6. The silicon-controlled rectifier according to claim 1, wherein the third heavily doped active region of the first conductivity type is in a floating status.

7. The silicon-controlled rectifier according to claim 1, further comprising:
- a first gate, formed on the substrate between the first heavily doped active region of the first conductivity type and the third heavily doped active region of the second conductivity type; and
- a second gate, formed on the substrate between the third heavily doped active region of the first conductivity type and the third heavily doped active region of the second conductivity type, wherein the first gate, the second gate, and the third heavily doped active region of the second conductivity type are electrically connected.

8. The silicon-controlled rectifier according to claim 1, further comprising:
- a self-aligned silicide block, formed on the substrate between the first heavily doped active region of the first conductivity type and the third heavily doped active region of the second conductivity type; and
- a second gate, formed on the substrate between the third heavily doped active region of the first conductivity type and the third heavily doped active region of the second conductivity type, wherein the second gate, and the third heavily doped active region of the second conductivity type are electrically connected.

\* \* \* \* \*